(12) United States Patent
Kim et al.

(10) Patent No.: US 11,842,941 B2
(45) Date of Patent: Dec. 12, 2023

(54) SEMICONDUCTOR PACKAGE STRUCTURE AND FABRICATION METHOD THEREOF

(71) Applicant: SAMSUNG ELECTRONICS CO., LTD., Suwon-si (KR)

(72) Inventors: Youngho Kim, Seoul (KR); Hwanpil Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/700,956

(22) Filed: Mar. 22, 2022

(65) Prior Publication Data
US 2022/0216121 A1 Jul. 7, 2022

Related U.S. Application Data

(63) Continuation of application No. 17/078,422, filed on Oct. 23, 2020, now Pat. No. 11,315,851, which is a
(Continued)

(30) Foreign Application Priority Data

Aug. 31, 2015 (KR) .................. 10-2015-0123166
Aug. 23, 2016 (KR) .................. 10-2016-0106744

(51) Int. Cl.
*H01L 23/34* (2006.01)
*H01L 23/367* (2006.01)
(Continued)

(52) U.S. Cl.
CPC ........ *H01L 23/367* (2013.01); *H01L 23/3677* (2013.01); *H01L 23/3736* (2013.01);
(Continued)

(58) Field of Classification Search
CPC ... H01L 23/367; H01L 23/3736; H01L 24/19; H01L 25/105; H01L 23/49816;
(Continued)

(56) References Cited

U.S. PATENT DOCUMENTS 6,809,421 B1 10/2004 Hayasaka et al.
10,559,521 B2 * 2/2020 Ishihara .............. H01L 23/3157
(Continued)

FOREIGN PATENT DOCUMENTS

| CN | 1512578 A | 7/2004 |
|---|---|---|
| JP | 10-256429 A | 9/1998 |

(Continued)

OTHER PUBLICATIONS

International Search Report dated Dec. 7, 2016, issued by the International Searching Authority in counterpart International Application No. PCT/KR2016/009634 (PCT/ISA/210).

*Primary Examiner* — Theresa T Doan
(74) *Attorney, Agent, or Firm* — Sughrue Mion, PLLC

(57) ABSTRACT

A method of fabricating a semiconductor package structure is provided. The structure is configured to include a base substrate, a die placed on the base substrate, the die including a semiconductor device, a solder bump placed on one surface of the die to exhaust heat generated in the die to an outside; and a solder ball placed on other surface of the die facing the one surface to transmit a signal, which is produced by the semiconductor device of the die, to an external device.

9 Claims, 19 Drawing Sheets

Related U.S. Application Data continuation of application No. 15/754,520, filed as application No. PCT/KR2016/009634 on Aug. 30, 2016, now Pat. No. 10,847,435.

(51) Int. Cl.

| | | |
|---|---|---|
| *H01L 23/373* | (2006.01) | |
| *H01L 23/40* | (2006.01) | |
| *H01L 23/492* | (2006.01) | |
| *H01L 23/00* | (2006.01) | |
| *H01L 25/10* | (2006.01) | |
| *H01L 23/498* | (2006.01) | |
| *H01L 23/538* | (2006.01) | |

(52) U.S. Cl.
CPC .......... *H01L 23/3738* (2013.01); *H01L 23/40* (2013.01); *H01L 23/492* (2013.01); *H01L 24/19* (2013.01); *H01L 25/105* (2013.01); H01L 23/49816 (2013.01); H01L 23/5389 (2013.01); H01L 2224/04105 (2013.01); H01L 2224/12105 (2013.01); H01L 2224/16225 (2013.01); H01L 2224/19 (2013.01); H01L 2224/73259 (2013.01); H01L 2924/15153 (2013.01)

(58) Field of Classification Search
CPC ....... H01L 23/5389; H01L 2224/04105; H01L 2224/12105; H01L 2224/16225; H01L 24/16; H01L 24/92; H01L 24/13; H01L 24/81; H01L 25/0655; H01L 2224/0401; H01L 2224/13144; H01L 23/4334; H01L 25/50; H01L 2224/16106; H01L 2224/16227; H01L 2224/16235; H01L 2224/24227; H01L 2224/81191; H01L 2224/81192; H01L 2224/92224; H01L 2225/1023; H01L 2225/1058; H01L 2225/1094; H01L 2924/15313; H01L 2924/18162; H01L 23/488; H01L 23/3735; H01L 23/481

USPC ....................................................... 257/712

See application file for complete search history.

(56) References Cited

U.S. PATENT DOCUMENTS

| | | | |
|---|---|---|---|
| 10,636,726 B2 * | 4/2020 | Ito | ......... H03H 9/1071 |
| 10,847,435 B2 | 11/2020 | Kim et al. | |
| 2004/0125579 A1 | 7/2004 | Konishi et al. | |
| 2005/0184377 A1 | 8/2005 | Takeuchi et al. | |
| 2006/0171130 A1 | 8/2006 | Konishi et al. | |
| 2008/0093749 A1 | 4/2008 | Gerber et al. | |
| 2009/0115050 A1 | 5/2009 | Kasuya et al. | |
| 2009/0309206 A1 | 12/2009 | Kim et al. | |
| 2010/0193949 A1 | 8/2010 | Belanger | |
| 2011/0186960 A1 | 8/2011 | Wu et al. | |
| 2012/0168936 A1 | 7/2012 | Huang et al. | |
| 2013/0127037 A1 | 5/2013 | Mori et al. | |
| 2013/0270230 A1 | 10/2013 | Cheung et al. | |
| 2014/0211437 A1 | 7/2014 | Ueta | |
| 2015/0084207 A1 | 3/2015 | Chauhan et al. | |
| 2015/0228591 A1 | 8/2015 | Kim et al. | |
| 2017/0345779 A1 | 11/2017 | Lin et al. | |

FOREIGN PATENT DOCUMENTS

| | | |
|---|---|---|
| JP | 11-168157 A | 6/1999 |
| JP | 2009-27042 A | 2/2009 |
| JP | 2012-9505 A | 1/2012 |
| JP | 201289642 A | 5/2012 |
| KR | 10-2012-0135897 A | 12/2012 |
| KR | 10-2015-0094135 A | 8/2015 |
| WO | 2011/122228 A1 | 10/2011 |

\* cited by examiner

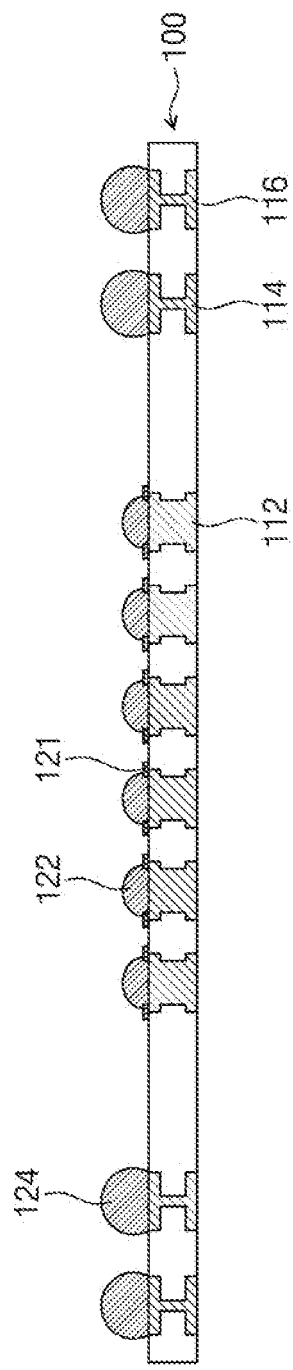
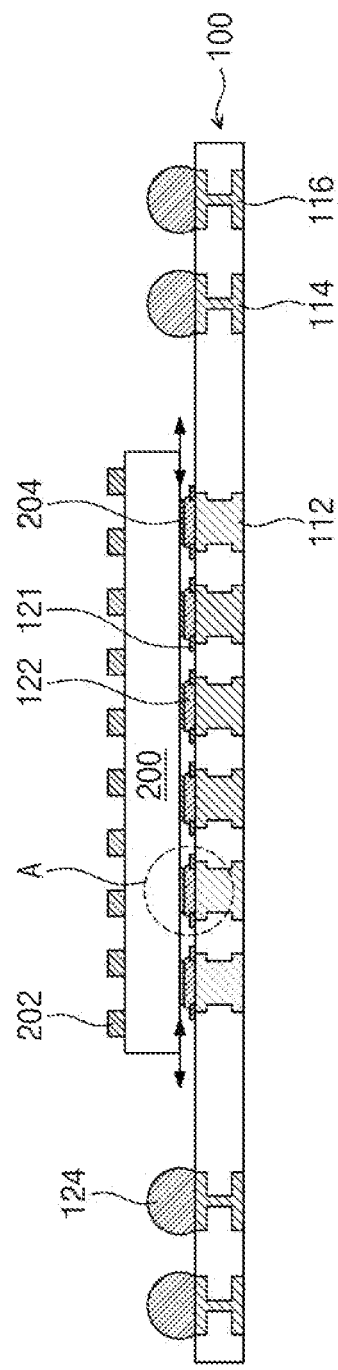

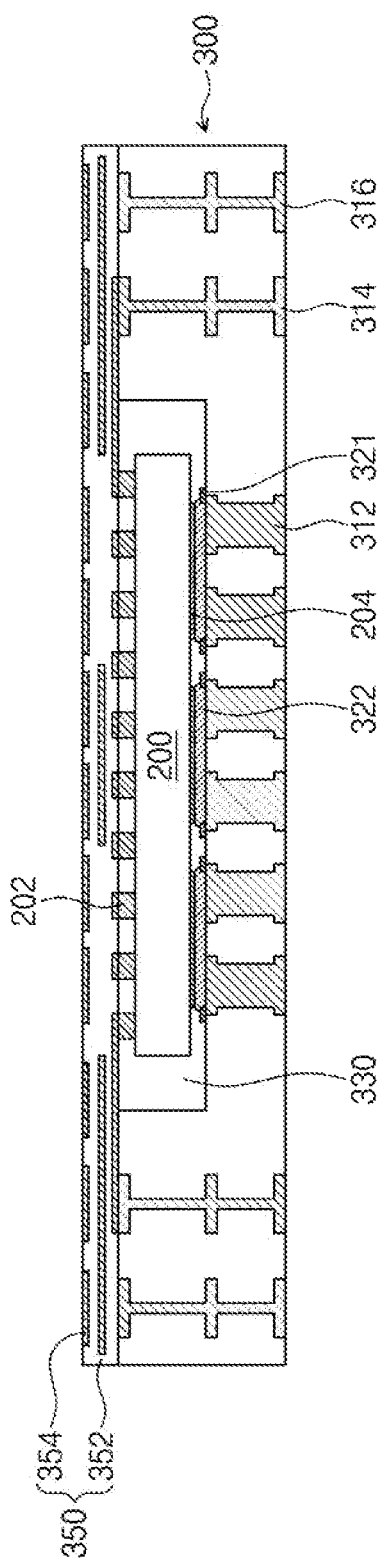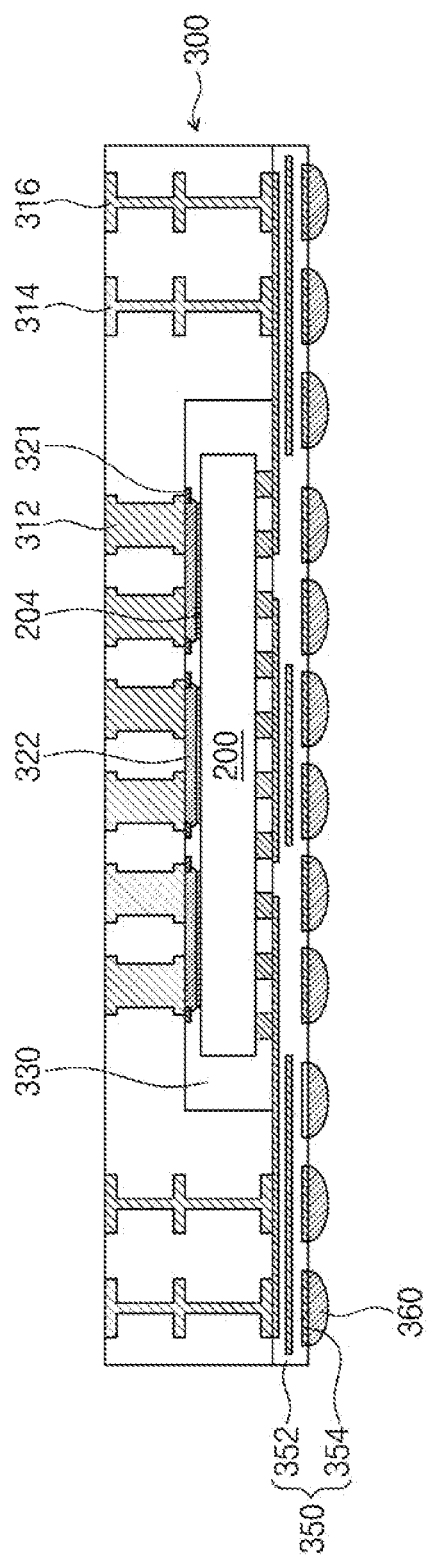

SEMICONDUCTOR PACKAGE STRUCTURE AND FABRICATION METHOD THEREOF

CROSS-REFERENCE TO RELATED APPLICATIONS

This is a Continuation Application of U.S. patent application Ser. No. 17/078,422 filed Oct. 23, 2020, which is a Continuation Application of U.S. patent application Ser. No. 15/754,520 filed Feb. 22, 2018, which is a National Stage of International Application No. PCT/KR2016/009634, filed Aug. 30, 2016, claiming priority based on Korean Patent Application No. 10-2015-0123166, filed Aug. 31, 2015 and Korean Patent Application No. 10-2016-0106744 filed Aug. 23, 2016, the contents of all of which are incorporated herein by reference in their entireties.

TECHNICAL FIELD

The inventive concept relates to a semiconductor package structure and a fabrication method thereof. If, in the case of using a metal layer formed on a back side of a flip chip die and a solder formed thereon in a wafer- or panel-level fan-out electronic packaging, the die placed on a substrate is reflowed, the die and a metal pad on the substrate are automatically self-aligned to each other, when temperature of the melted solder is returned to a room temperature, thereby allowing the die to be formed on the substrate with a high positional accuracy. In the exemplary embodiments of the inventive concept, this phenomenon is used to fabricate a package of a semiconductor device requiring many input/output terminals. In addition, it relates to a semiconductor package structure including a heat dissipation plug, which discharges heat generated in the die to the outside, and a fabrication method thereof.

BACKGROUND ART

An application processor, which is one of key components used in smart devices (e.g., smart phones, tablet personal computers (PCs), and so forth), is being developed to have higher performance and more functions. Accordingly, a clock speed for driving a chip becomes faster, and a size of the chip becomes smaller.

Since costs of fabricating a system-on-chip (SOC) semiconductor chip is very high, a process and a structure that can prevent a known good die (KGD) from being lost in an assembly step of a back-end process is considered to reduce total production costs and increase a profit of a product employing the SOC semiconductor chip. There are many input/output terminals in such system semiconductor dies that requires formation of high density patterns to connect them to each other. To realize a process for the high density patterns, it is required to align positions of pads provided on a die to positions of vias to be connected to the patterns, and moreover, as a size of the pattern decreases, an accuracy in position of the die on a substrate becomes more important to have great influence on a pattern yield and an overall product yield. Thus, accurate positioning of a die is a major issue that should be addressed. Furthermore, in terms of performance of a device and efficiency in characteristics of the device, heat generated in an application processor affects performance of a device and causes reduction in a life span of the device and deterioration in reliability, and thus, efficiently removing heat generated in a process of operating the device is also considered as an emerging issue. Particularly, a mobile or wearable device is being developed in the form of a system-on-chip as low-power, high-speed, and high-performance properties are required, a demand of technology for efficiently dissipating heat generated in a device to the outside has increased.

In addition, since an electronic package having a three-dimensional structure has complexity of various materials, electrical, mechanical, and thermal reliability problems are likely to occur. Furthermore, for a mobile application processor, many circuits are provided in the form of a system-on-chip, and thus, heat generated in the chip leads to deterioration in performance and reliability of the device. Accordingly, selecting a technology and a structure for a package having a heat-dissipation function is in demand.

DISCLOSURE

Technical Problem

A technical problem to be addressed by the exemplary embodiments of the inventive concept is to provide a semiconductor package structure having a high accuracy and a high yield using a self-alignment effect and a fabrication method thereof.

In more detail, a technical problem to be addressed by the exemplary embodiments of the inventive concept is to provide a method of improving an accuracy in position of a die on a substrate in an assembling process and, thus, of reducing a process loss, which may occur when vias of a re-distribution structure are aligned and connected to pads of the die in a subsequent re-distribution process. Thus, the exemplary embodiments of the inventive concept may be used to provide a semiconductor package structure having a high accuracy, a high yield, and a high heat-dissipating property and a fabrication method thereof.

A technical problem to be addressed by the exemplary embodiments of the inventive concept is to provide a highly-reliable semiconductor package structure and a fabrication method thereof.

A technical problem to be addressed by the exemplary embodiments of the inventive concept is to provide a semiconductor package structure, which is cost effectively fabricated by a simplified process, and a fabrication method thereof.

A technical problem to be addressed by the exemplary embodiments of the inventive concept is to provide a fabricating method of a semiconductor package structure, for which an existing fabrication system can be exploited as it is.

A technical problem to be addressed by the exemplary embodiments of the inventive concept is to provide a compact semiconductor package structure.

Technical problems to be addressed by the exemplary embodiments of the inventive concept are not limited to the afore-described problems.

Technical Solution

To address the technical problems, the exemplary embodiments of the inventive concept provide a semiconductor package structure.

According to an exemplary embodiment, a semiconductor package structure may include: a base substrate; a die disposed on the base substrate, the die including a semiconductor device; a solder bump disposed on a surface of the die, and configured to discharge heat generated in the die to an outside; and a solder ball disposed on another surface, opposite to the surface, of the die, and configured to transmit a signal, which is produced by the semiconductor device of the die, to an external device.

According to an exemplary embodiment, a direction of the heat, which is generated in the die and is discharged to the outside through the solder bump, and a direction of the signal, which is produced by the semiconductor device in the die and is transmitted to the external device through the solder ball, may be anti-parallel to each other.

According to an exemplary embodiment, the base substrate may further include a heat dissipation plug penetrating the base substrate, and the heat dissipation plug may be connected to the solder bump.

According to an exemplary embodiment, the solder bump may include a first portion facing the die and a second portion facing the heat dissipation plug, and a width of the first portion may be smaller than a width of the second portion.

According to an exemplary embodiment, the heat dissipation plug may be provided in plural, and the solder bump may be connected to the plurality of the heat dissipation plugs.

According to an exemplary embodiment, a joining pattern may be disposed between the die and the solder bump to provide an interface between the die and the solder bump.

According to an exemplary embodiment, the joining pattern may be electrically disconnected from the semiconductor device.

According to an exemplary embodiment, the semiconductor package structure may further include a solder mask, which is provided between the substrate and the solder bump to define an opening area in a shape corresponding to the joining pattern, and the solder bump may be coupled to the substrate through the opening area.

According to an exemplary embodiment, the base substrate may have a plate shape.

According to an exemplary embodiment, the base substrate may include a cavity, and the die may be disposed in the cavity.

According to an exemplary embodiment, the base substrate may further include a connecting plug, and an additional die comprising another semiconductor device and electrically connected to the connecting plug may be disposed on the die.

According to an exemplary embodiment, the semiconductor package structure may further include a neighboring die adjacent to the die. The die and the neighboring die may be electrically connected to each other.

According to an exemplary embodiment, a semiconductor package structure may include: a base substrate; a die disposed on the base substrate, the die including a semiconductor device; a heat dissipation plug disposed on a surface of the die to discharge heat generated in the die to an outside; and a solder ball disposed on another surface, opposite to the surface, of the die and configured to transmit a signal, which is produced by the semiconductor device of the die, to an external device.

According to an exemplary embodiment, a direction of the heat, which is generated in the die and is discharged to the outside through the heat dissipation plug, and a direction of the signal, which is produced by the semiconductor device in the die and is transmitted to the external device through the solder ball, may be anti-parallel to each other.

To address the technical problems, the exemplary embodiments of the inventive concept provide a method of fabricating a semiconductor package structure.

According to an exemplary embodiment, a method of fabricating a semiconductor package structure may include: preparing a base substrate; preparing a die including a semiconductor device; bonding and self-aligning the die to the base substrate by providing a first solder bump on a surface of the base substrate, and then, reflowing the first solder bump; forming a re-distribution layer on another surface, opposite to the surface, of the die, the re-distribution layer including an interconnection line electrically connected to the semiconductor device; and forming a solder ball, which is electrically connected to the interconnection line of the re-distribution layer, on the re-distribution layer.

According to an exemplary embodiment, the base substrate may further include a connecting plug. The bonding and the self-aligning the die to the base substrate may include providing a second solder bump, which is in a liquid state, on the connecting plug, and the method may further include placing an additional die connected to the connecting plug on the die.

According to an exemplary embodiment, the base substrate may further include a heat dissipation plug, which penetrates the base substrate and is in contact with the first solder bump, and heat generated in the die may be exhausted to an outside through the first solder bump and the heat dissipation plug.

According to an exemplary embodiment, the method may further include removing the first solder bump and the base substrate on the surface of the die, after the forming the solder ball on the re-distribution layer.

According to an exemplary embodiment, the removing may be performed to remove a portion of the die on a surface in a direct contact with the first solder bump.

According to an exemplary embodiment, in the preparing the base substrate, the base substrate may further include a solder mask defining an opening area for coupling the first solder bump onto the base substrate, and in the bonding and self-aligning the die to the base substrate, the first solder bump may be coupled to the opening area by the reflow, thereby allowing the die to be self-aligned onto the base substrate.

Advantageous Effects

According to an exemplary embodiment, a semiconductor package structure includes: a base substrate; a die disposed on the base substrate to include a semiconductor device; a solder bump disposed on a surface of the die, and configured to dissipate heat generated in the die to an outside, and a solder ball disposed on another surface, opposite to the surface, of the die to transmit a signal produced by the semiconductor device of the die to an external device. Thus, by a reflow process of the solder bump, the die may be self-aligned to the base substrate. Accordingly, a process margin may be improved, and thus, a fabrication yield may be improved. In addition, a fabrication process may be simplified to provide a semiconductor package structure, of which fabrication costs are reduced, and which has a high heat-dissipating property. Furthermore, since heat generated in the die can be easily exhausted to the outside through the solder bump, a semiconductor package structure having a high heat-dissipating property and a fabrication method thereof can be provided.

Furthermore, the die may be self-aligned to the base substrate by the reflow process of the solder bump. Accordingly, a process margin may be improved, and thus, a fabrication yield may be improved. In addition, a fabrication process may be simplified to provide a semiconductor package structure, whose fabrication cost is reduced, and which has a high heat-dissipating property, and a fabrication method thereof.

DESCRIPTION OF THE DRAWINGS

FIGS. 1 to 8 are diagrams illustrating a semiconductor package structure and a fabrication method thereof, according to a first exemplary embodiment.

FIGS. 15 to 18 are diagrams illustrating a semiconductor package structure and a fabrication method thereof, according to a second exemplary embodiment.

EXEMPLARY EMBODIMENTS

Figure 3:
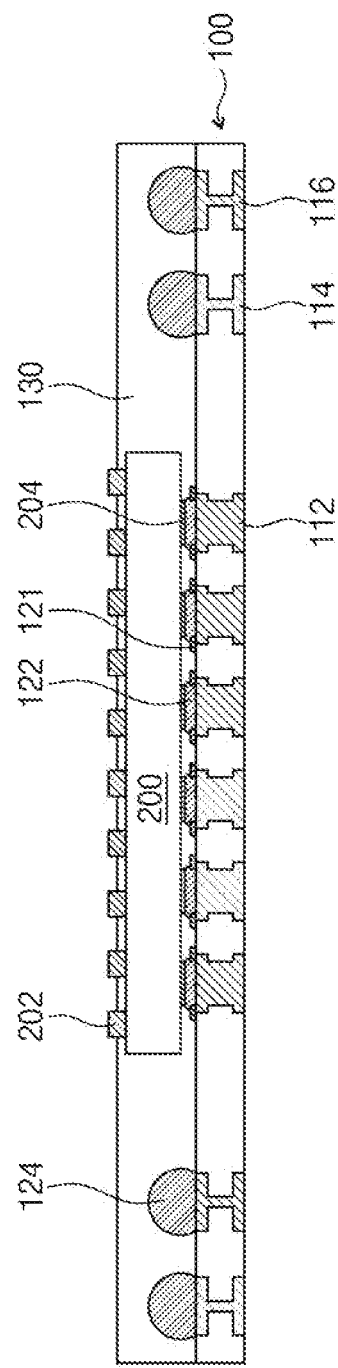

Exemplary embodiments of the inventive concept will now be described fully with reference to the accompanying drawings. The inventive concept may, however, be embodied in many different forms and should not be construed as being limited to the embodiments set forth herein. Rather, these embodiments are provided so that this disclosure will be thorough and complete, and will fully convey the inventive concept to those of ordinary skill in the art.

In this specification, when it is said that any element is positioned on other elements, it means the element is directly on the other element or above the other element with at least one intermediate part. In the drawings, the thicknesses of layers and regions are exaggerated, for better understanding and ease of description.

It will be understood that, although the terms "first", "second", "third", etc. may be used herein to describe various elements, these elements should not be limited by these terms. These terms are only used to distinguish one element from another element. Thus, a first element discussed below could be referred to as a second element. Each embodiment described and illustrated herein includes its complementary embodiment as well. As used herein the term "and/or" includes any and all combinations of one or more of the associated listed items.

As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. In the present specification, it will be understood that when an element is referred to as being "connected" or "coupled" to another element, it can be directly connected or coupled to the other element or intervening elements may be present.

Further, in the description of the exemplary embodiments, when it is determined that the detailed description of the related art would obscure the gist of the inventive concept, the description thereof will be omitted.

Figure 7:
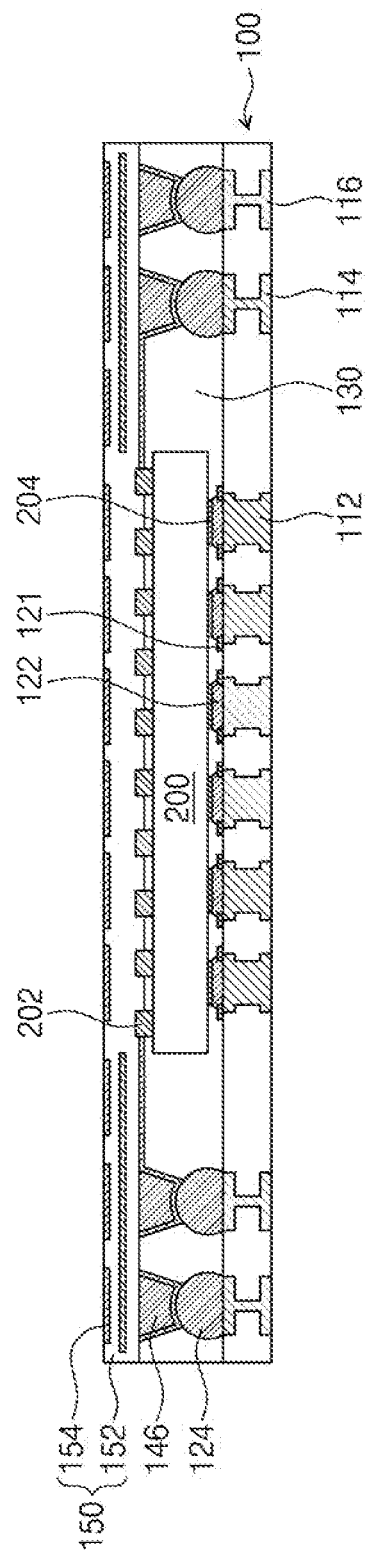
Figure 8:
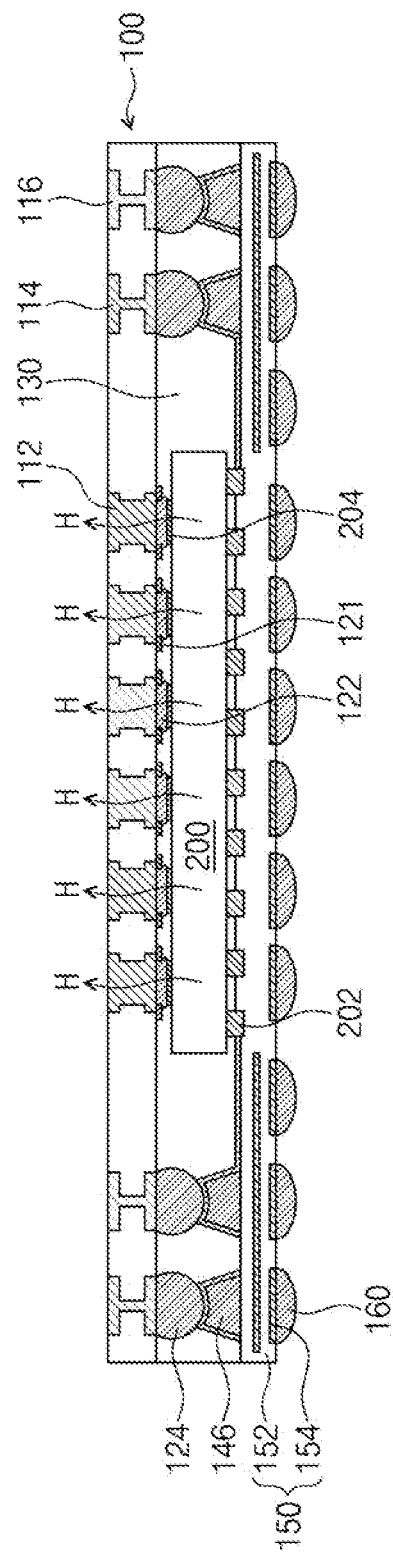
Figure 9:
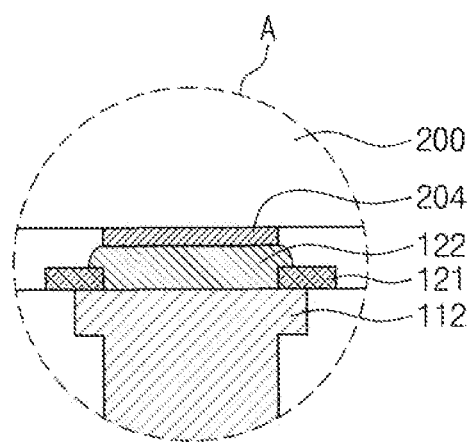
FIG. 9 is an enlarged diagram illustrating a portion 'A' of FIG. 2.

FIGS. 1 to 8 are diagrams illustrating a semiconductor package structure and a fabrication method thereof, according to a first exemplary embodiment, and FIG. 9 is an enlarged diagram illustrating a portion 'A' of FIG. 2.

Referring to FIG. 1, a base substrate 100 may be prepared. The base substrate 100 may be a printed circuit board (PCB) substrate. The base substrate 100 may include a heat dissipation plug 112, a first connecting plug 114, and a second connecting plug 116.

The heat dissipation plug 112, the first connecting plug 114, and the second connecting plug 116 may penetrate the base substrate 100. Accordingly, opposite ends of the heat dissipation plug 112, opposite ends of the first connecting plug 114, and opposite ends of the second connecting plug 116 may be exposed. The heat dissipation plug 112 may be provided for discharge heat, which is generated in a die 200 to be described below, to the outside, and the first connecting plug 114 and the second connecting plug 116 may be provided for connection with another die that is stacked on the die 200 in a package-on-package (POP) structure and a system-in-package (SiP) structure.

As shown in FIG. 1, the heat dissipation plug 112, the first connecting plug 114, and the second connecting plug 116 may be provided in plural. In addition, a plurality of the first heat dissipation plugs 112 may be disposed in a center portion of the base substrate 100, and the first connecting plug 114 and the second connecting plug 116 may be disposed in an edge portion of the base substrate 100.

All of the heat dissipation plug 112, the first connecting plug 114, and the second connecting plug 116 may be formed of the same metal. For example, the heat dissipation plug 112, the first connecting plug 114, and the second connecting plug 116 may be formed of copper (Cu), aluminum (Al), gold (Au), or the like.

Solder bumps 122 and 124 may be provided on the heat dissipation plug 112, the first connecting plug 114, and the second connecting plug 116. In detail, first solder bumps 122 may be provided on the heat dissipation plug 112, and second solder bumps 124 may be provided on the first connecting plug 114 and the second connecting plug 116. For a subsequent reflow process, the solder bumps 122 and 124 may be formed of a metallic material having a relatively low melting point. For example, the solder bumps 122 and 124 may be formed of lead (Pb), tin (Sb), gold (Au), or the like.

According to an exemplary embodiment, a solder mask 121 may be formed between the heat dissipation plug 112 and the solder bump 122. The solder mask 121 may be formed of, for example, an epoxy-containing insulating ink. The solder mask 121 may define a solder mask define area, through which the heat dissipation plug 112 is in contact with the solder bump 122. The solder mask define area, which is opened by the solder mask 121, may have a shape and a size corresponding to, for example, the same shape and size as, a joining pattern 204 to be described below. Accordingly, although the solder mask 121 defines an area, through which the solder bump 122 is provided to be in direct contact with the heat dissipation plug 112, the solder mask 121 may maximize a self-alignment effect to be described below, because it provides the same shape and size as the joining pattern 204.

In the following descriptions, if it is called a solder bump, it may be interpreted to refer to the first solder bump 122.

According to an exemplary embodiment, a size of the first solder bump 122 may be smaller than that of the second solder bump 124, as shown in FIG. 1.

Figure 25:
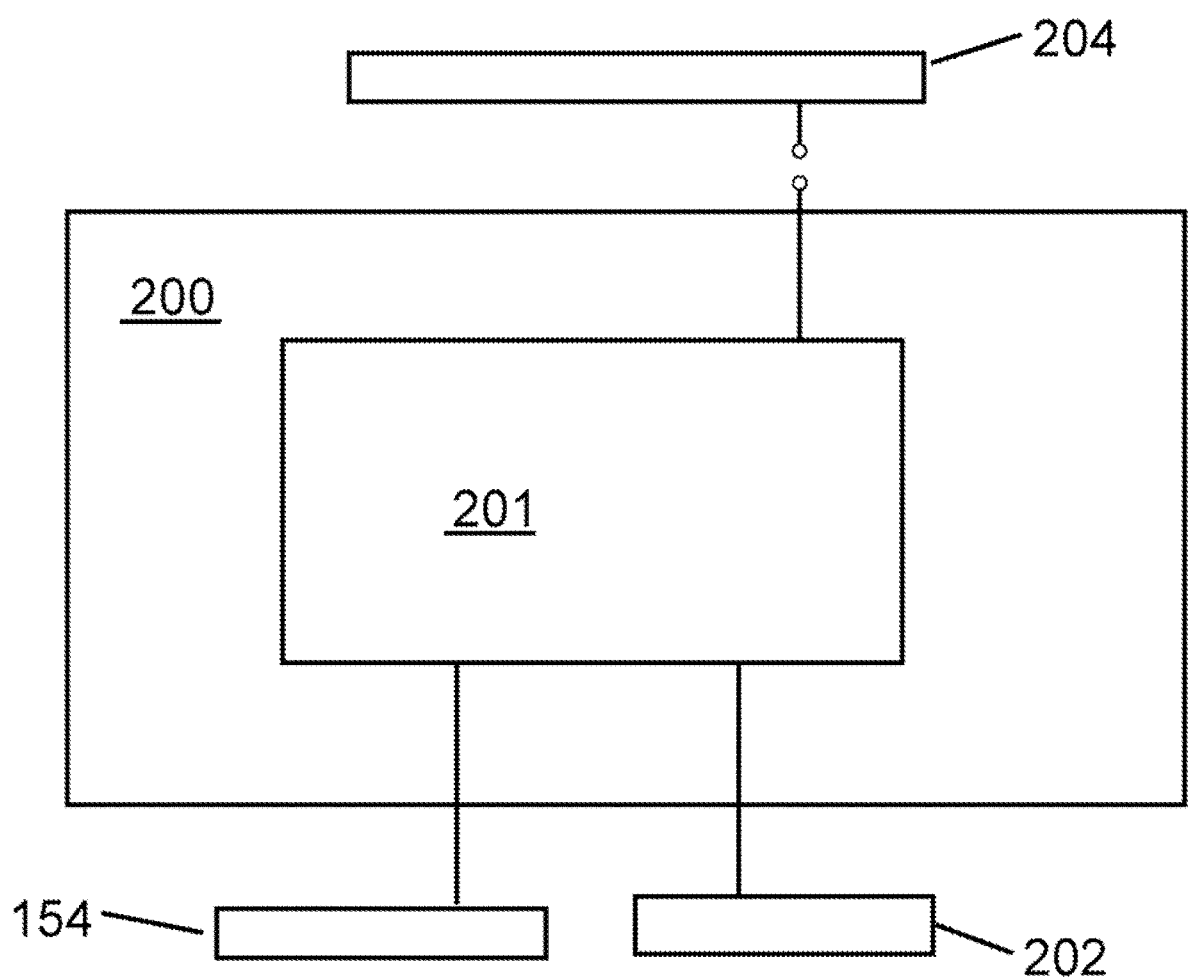
FIG. 25 is a block diagram schematically illustrating electrical connections in a semiconductor package structure according to an exemplary embodiment.

Referring to FIGS. 2, 9 and 25, a die 200 including a semiconductor device may be prepared. The semiconductor device in the die 200 may include, for example, transistors, capacitors, or memory cells (FLASH memory, dynamic random access memory (DRAM), or the like). For example, the die 200 may be an application processor chip, a memory chip, a graphic chip, or the like. For example, as illustrated in FIG. 25, semiconductor device 201 may be electrically connected to an interconnection line 154 via a contact pad 202.

The die 200 may include one surface and another surface opposite to the one surface. The one surface of the die 200 may be a surface (an active surface) on which the semiconductor devices are disposed to be adjacent one another. In other words, in the case where, for example, the die 200 includes a transistor formed on a silicon substrate, the one surface of the die 200 may correspond to a top surface of the silicon substrate, on which the transistor is formed, and the other surface of the die 200 may correspond to a bottom surface of the silicon substrate.

Contact pads 202 may be disposed on the one surface of the die 200. The contact pads 202 may be electrically connected to the semiconductor devices in the die 200. The contact pad 202 may be formed of, for example, copper (Cu), titanium (Ti), aluminum (Al), or the like.

The joining patterns 204 may be disposed on the other surface of the die 200. The joining pattern 204 may be a pattern for improving interfacial characteristics between the die 200 and the first solder bump 122. That is, the joining pattern 204 may improve an adhesive strength between the first solder bump 122 and the die 200. For this, the joining pattern 204 may be formed of a double layer containing metals (e.g., titanium having good interfacial characteristics to the silicon of the die 200 and copper having good interfacial characteristics to the first solder bump 122).

The joining patterns 204 may not be electrically connected to the semiconductor devices. In other words, the joining patterns 204 may be in direct contact with the other surface of the die 200 but may be disconnected from the semiconductor devices in the die. For example, as illustrated in FIG. 25, semiconductor device 201 is not electrically connected from the joining pattern 204.

The die 200 may be disposed on the base substrate 100 provided with the first solder bump 122. In more detail, the die 200 may be provided on the base substrate 100, such that the joining patterns 204 of the die 200 are in contact with the first solder bumps 122 formed on the solder mask 121.

The first solder bump 122 may be reflowed, and thus, the die 200 may be easily bonded and aligned to the base substrate 100. That is, even when the die 200 is laterally shifted, due to a surface tension of the first solder bump 122 melted by the reflow, the die 200 may be self-aligned onto the base substrate 100. Since the die 200 is self-aligned onto the base substrate 100, it may be possible to improve a process yield in a fine-pitch semiconductor process.

The first solder bump 122 may include a first portion facing the die 200 and a second portion facing the heat dissipation plug 122. As shown in FIGS. 1 and 2, the first solder bump 122 may be provided on the heat dissipation plug 112, and then, the die 200 may be provided on the heat dissipation plug 112, and in this case, the first portion may have a width that is smaller than that of the second portion.

Referring to FIG. 3, after placing the die 200 on the base substrate 100, a polymer resin layer 130 may be formed on the base substrate 100 and the die 200. For example, the polymer resin layer 130 may be formed of epoxy. The polymer resin layer 130 may be formed to cover the die 200 and the solder bump 122 and 124, and to expose at least a portion of the contact pad 202. In other words, the polymer resin layer 130 may not cover an upper portion of the contact pad 202.

Figure 4:
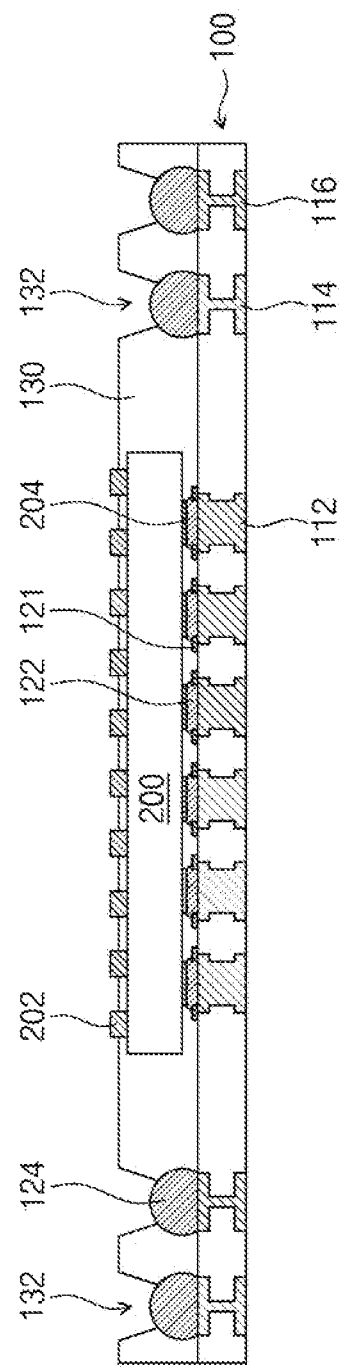

Referring to FIG. 4, the polymer resin layer 130 may be patterned to form a contact hole 132 exposing the second solder bump 124. According to an exemplary embodiment, a laser may be used to pattern the polymer resin layer 130. Alternatively, according to another exemplary embodiment, the polymer resin layer 130 may be patterned by a chemical etching method.

Figure 5:
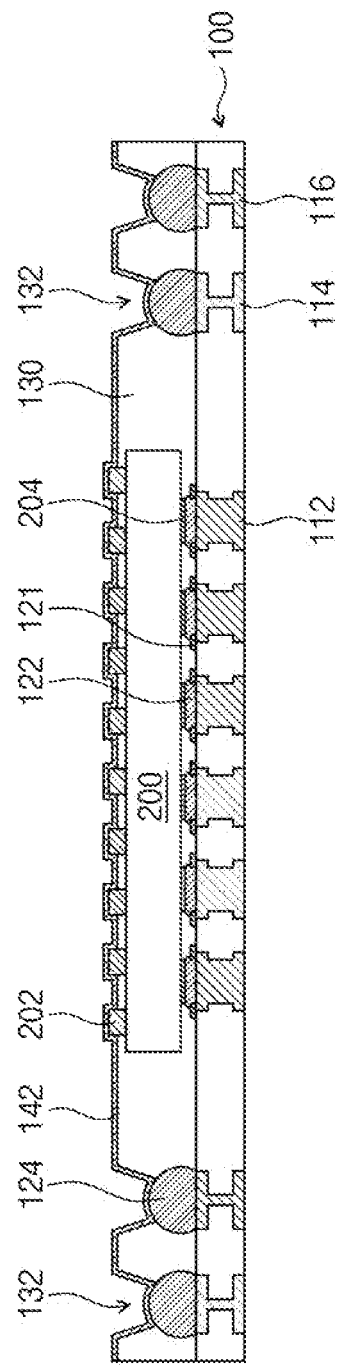

Referring to FIG. 5, a seed layer 142 may be conformally formed on the polymer resin layer 130 with the contact hole 132. The seed layer 142 may be formed along an inner surface of the contact hole 132 and may also be formed on the exposed contact pad 202. For example, the seed layer 142 may be formed of copper (Cu), zinc (Zn), nickel (Ni), or the like. According to an exemplary embodiment, the seed layer 142 may be formed by an electro-less plating method.

Figure 6:
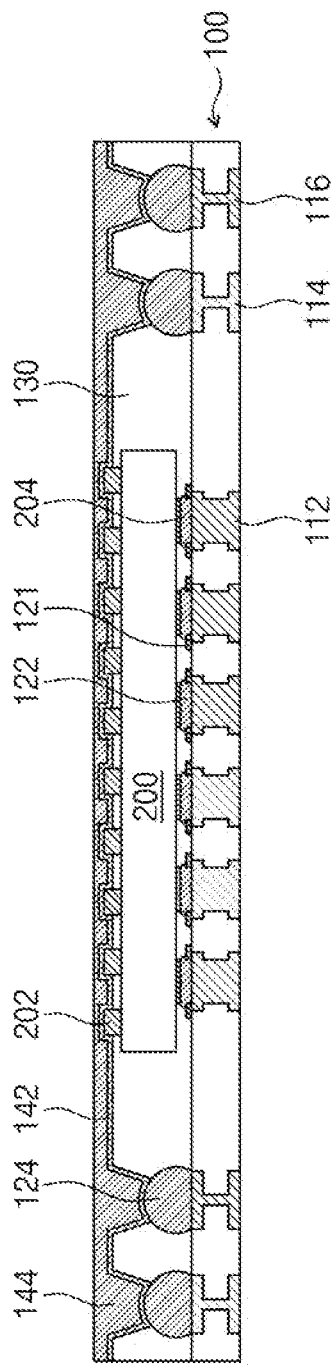

Referring to FIG. 6, after the formation of the seed layer 142, a metal layer 144 may be formed on the polymer resin layer 130 with the contact hole 132. The metal layer 144 may fill the contact hole 132. Owing to the metal layer 144, the contact pads 202 may be electrically connected to each other. The metal layer 144 may be formed of the same material as the seed layer 142. According to an embodiment, the metal layer 144 may be formed by an electroplating method.

Referring to FIG. 7, the metal layer 144 may be patterned to form a contact plug 146 in the contact hole 132 and to separate the contact pads 202 from one another. In addition, some of the contact pads 202 may be connected to the contact plug 146. For example, the metal layer 144 may be patterned in such a way that some of the contact pads 202 are electrically connected to the contact plug 146 on the first connecting plug 114, as shown in FIG. 7.

Unlike that shown in FIG. 7, the connection structure between the contact pads 202, and the connection structure between the contact pads 202 and the contact plug 146 may be implemented in various forms, and the present embodiment of the inventive concept are not limited to that shown in FIG. 7.

A re-distribution layer 150 may be formed on the die 200. The re-distribution layer 150 may include an interconnection line 154, which is electrically connected to the semiconductor device in the die 200, and a passivation layer 152. The interconnection line 154 may be formed of, for example, copper (Cu), aluminum (Al), titanium (Ti), or the like, and the passivation layer 152 may be formed of silicon oxide, silicon nitride, or the like. Here, it is obvious that the interconnection line 154 can be formed in a multi-layered structure.

Referring to FIG. 8, a solder ball 160 electrically connected to the interconnection line 154 of the re-distribution layer 150 may be formed on the re-distribution layer 150. The solder ball 160 may be formed of, for example, lead (Pb), tin (Sb), gold (Au), or the like.

After the formation of the solder ball 160, the die 200 and the base substrate 100 including the re-distribution layer 150 may be upside down, and the solder ball 160 may be connected to an external device. Thus, signals produced in the semiconductor device in the die 200 may be transmitted to the external device. In addition, the heat produced in the die 200 may be discharged to the outside by the heat dissipation plug 112. In detail, heat, which is generated as a result of operations of the semiconductor device in the die 200 may sequentially pass through the first solder bump 122 and the heat dissipation plug 112, and then, may be discharged to the outside. Accordingly, a direction of discharging the heat, which is generated in the die 200 and then is discharged to the outside, may be anti-parallel to a transmission direction of a signal, which is produced by the semiconductor device in the die 200 and is transmitted to the external device through the solder ball 160.

Unlike the afore-described embodiment of the inventive concept, in the case of a package structure discharging heat generated in the die to the outside using a heat sink, there is a limitation in realizing a package structure having a thin thickness, because of a thickness and a size of the heat sink. Also, in the case of a package structure discharging heat generated in the die to the outside using a thermal interface material (TIM), there is a limitation in realizing a package structure having both of a high heat-dissipating property and stability, because the better the heat-transfer property of the TIM is, the worse a processing property and reliability is.

However, as described above, according to an exemplary embodiment, due to the first solder bump 122 and the heat dissipation plug 112 sequentially connected to the die 200, heat generated in the die 200 may be efficiently dissipated to the outside. Accordingly, the use of the TIM may be omitted, and thus, it may be possible to simplify a fabrication process, to reduce fabrication costs, and to provide a semiconductor package structure having a small thickness and a high heat-dissipating property and a fabrication method thereof.

In addition, according to an exemplary embodiment, the die 200 may be directly provided on the base substrate 100 with the first solder bump 122, and then, the first solder bump 122 may be reflowed, such that the die 200 is self-aligned to the base substrate 100. That is, even when the die 200 is laterally shifted, due to a surface tension of the first solder bump 122 melted by the reflow, the die 200 may be self-aligned onto the base substrate 100.

Recently, a semiconductor package structure having a high wiring density (especially, having many input/output terminals) is required, and in order to embody the high wiring density, alignment for connection between the contact pad 202 provided on other surface of the die 200 and a via (e.g., a re-distribution layer) is an important design parameter. In this regard, when the die 200 is formed on the base substrate 100, there is an initial error of about 5 to 10 micrometers, and even in such a case, a reflow process may allow the first solder bump 122 to have a surface tension, and thus, allow the die 200 to be self-aligned at a proper position on the base substrate 100. In other words, the first solder bump 122 may be provided on a surface opposite to a surface on which the contact pad 202 of the die 200 are formed, and here, since the reflow process is performed on the first solder bump 122 provided between the die 200 and the base substrate 100, the die 200 may be self-aligned by the surface tension of the first solder bump 122, when the first solder bump 122 is returned from a melted state to a room temperature state. Thus, it may be possible to dispose the contact pad 202 of the die 200 at a proper position. Especially, since the solder mask 121 provides a solder mask define area, whose shape and size are the same as those of the joining pattern 204, on the heat dissipation plug 112, the solder bump 12 may allow the die 200 to be self-aligned at a proper position on the base substrate in the reflow process.

Accordingly, a method of fabricating a semiconductor structure package, according to an exemplary embodiment, can provide a semiconductor package structure having a high wiring density (especially, having many input/output terminals) and moreover can improve a yield.

In addition, according to an exemplary embodiment, a PCB substrate may be used as the base substrate 100. Accordingly, unlike the solder bump, it may be possible to omit a process of placing a chip on an additional substrate (artificial substrate) using an adhesive layer, and then, additionally mounting it on a PCB. Thus, it may be possible to prevent an alignment error from being caused by thermal expansion of the adhesive layer, and a fabrication process may be simplified to provide a semiconductor package structure, of which fabrication costs are reduced, and which has a high heat-dissipating property, and a fabrication method thereof.

Furthermore, according to an exemplary embodiment, processes of forming the first solder bump 122 on the heat dissipation plug 112 of the base substrate 100 and placing the die 200 on the first solder bump 122 may be performed using the existing fabrication system as it is. Accordingly, it may be possible to provide a semiconductor package structure having a high heat-dissipating property and a fabrication method thereof while suppressing modification of a fabrication system and investment in new system.

According to modified examples of the first exemplary embodiment, the first solder bump 122 may be provided on the die 200, and then, may be bonded to the heat dissipation plug 112 of the base substrate 100, unlike that described with reference to FIGS. 1 to 8. Hereinafter, a method of fabricating a semiconductor package structure, according to the modified examples of the first embodiment of the present invention, will be described with reference to FIGS. 10 and 11.

Figure 10:
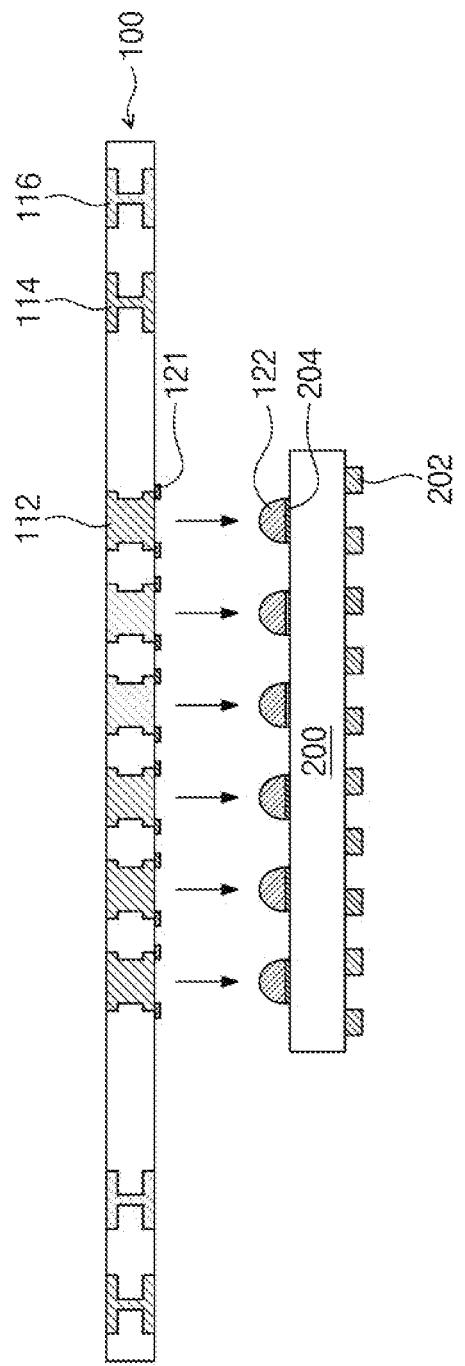
FIG. 10 is a diagram illustrating a method of fabricating a semiconductor package structure, according to a first modified example of the first exemplary embodiment.

FIG. 10 is a diagram illustrating a method of fabricating a semiconductor package structure, according to a first modified example of the first exemplary embodiment.

Referring to FIG. 10, the die 200 described with reference to FIG. 2 and the base substrate 100 described with reference to FIG. 1 are prepared. The first solder bump 122 described with reference to FIG. 1 may be provided on the joining pattern 204 of the die 200.

The first solder bump 122 may be formed on the joining pattern 204 of the die 200, and then, the base substrate 100 may be bonded to the first solder bump 122 on the joining pattern 204. Here, the first solder bump 122 may be bonded to an opening region, which is defined by a solder mask 121 formed on the heat dissipation plug 112. In more detail, the die 200 may be fixed, whereas the base substrate 100 may be moved to bond the opening region, which is defined by the solder mask 121 on the heat dissipation plug 112 of the base substrate 100, to the first solder bump 122 on the joining pattern 204. Thereafter, as described with reference to FIG. 2, the first solder bump 122 may be reflowed, such that the die 200 is bonded and self-aligned to the base substrate 100.

Thereafter, the process described with reference to FIGS. 3 to 8 may be performed, and thus, the semiconductor package structure according to the first modified example of the first exemplary embodiment may be fabricated.

Figure 11:
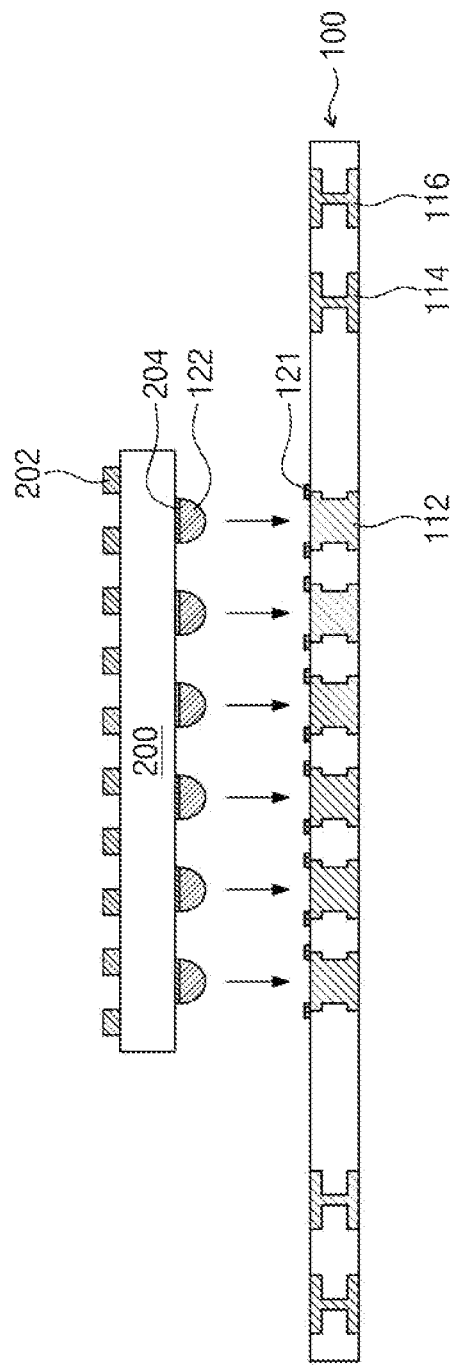
FIG. 11 is a diagram illustrating a method of fabricating a semiconductor package structure, according to a second modified example of the first exemplary embodiment.

FIG. 11 is a diagram illustrating a method of fabricating a semiconductor package structure, according to a second modified example of the first exemplary embodiment.

Referring to FIG. 11, the die 200 described with reference to FIG. 2 and the base substrate 100 described with reference to FIG. 1 are prepared. As described with reference to FIG. 10, the first solder bump 122 described with reference to FIG. 1 may be provided on the joining pattern 204 of the die 200.

The first solder bump 122 may be formed on the joining pattern 204 of the die 200, and then, the base substrate 100 may be bonded to the first solder bump 122 on the joining pattern 204. Here, the first solder bump 122 may be bonded to an opening region, which is defined by a solder mask 121 formed on the heat dissipation plug 112. In more detail, the base substrate 100 may be fixed, whereas the die 200 may be moved to bond the opening region, which is defined by the solder mask 121 on the heat dissipation plug 112 of the base substrate 100, to the first solder bump 122 on the joining pattern 204. Thereafter, as described with reference to FIG. 2, the first solder bump 122 may be reflowed, such that the die 200 is bonded and self-aligned to the base substrate 100.

Thereafter, the process described with reference to FIGS. 3 to 8 may be performed to fabricate the semiconductor package structure according to the second modified example of the first exemplary embodiment.

According to a third modified example of the first exemplary embodiment, a first solder bump may be connected to a plurality of heat dissipation plugs, unlike the afore-described first exemplary embodiment and its modified examples. Hereinafter, the semiconductor package structure according to the third modified example of the first exemplary embodiment will be described with reference to FIG. 12.

Figure 12:
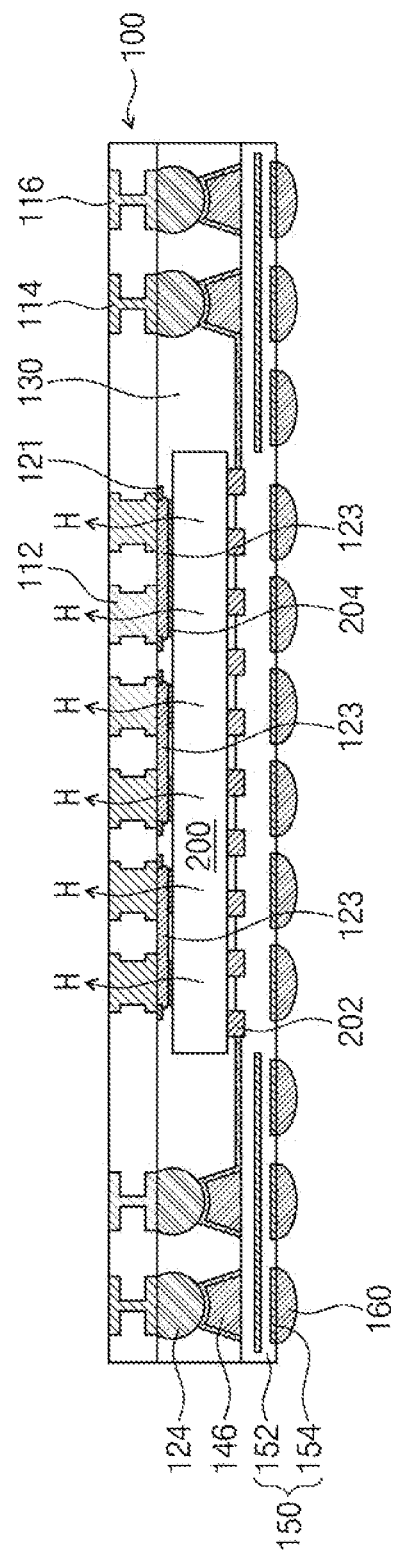
FIG. 12 is a diagram illustrating a semiconductor package structure according to a third modified example of the first exemplary embodiment.

FIG. 12 is a diagram illustrating a semiconductor package structure according to the third modified example of the first exemplary embodiment.

Referring to FIG. 12, the semiconductor package structure according to the first exemplary embodiment described with reference to FIG. 8 may be provided, but a first solder bump 123, which is provided on the die 200 and the heat dissipation plug 112, may be connected to a plurality of the heat dissipation plugs 112.

As described with reference to FIG. 1, the first solder bump 123 may be provided in an opening region defined by the solder mask 121 on the heat dissipation plug 112 of the base substrate 100, but one first solder bump 123 may be provided on a plurality of the heat dissipation plugs 112. For example, in the case where one joining pattern 204 corresponds to two heat dissipation plugs 112, the solder mask 121 may define an opening region having the same shape and size as the one joining pattern 204 on the two heat dissipation plugs 112.

In the case where, according to the third modified example of the first exemplary embodiment, the first solder bump 123 is connected to a plurality of the heat dissipation plugs 112, it may be possible to improve heat transfer efficiency of heat to be transferred from the die 200 to the heat dissipation plug 112. Accordingly, a semiconductor package structure having a high heat-dissipating property may be provided.

Furthermore, although, in FIG. 12, the first solder bump 123 is illustrated to be connected to two heat dissipation plugs 112, but the inventive concept is not limited thereto. For example, it is obvious to those skilled in the art that the first solder bump 123 may be connected to three or more heat dissipation plugs 112.

According to a fourth modified example of the first exemplary embodiment, a semiconductor package structure including a stack of dies may be provided, unlike the afore-described first exemplary embodiment and its modified examples. Hereinafter, the semiconductor package structure according to the fourth modified example of the first exemplary embodiment will be described with reference to FIG. 13.

Figure 13:
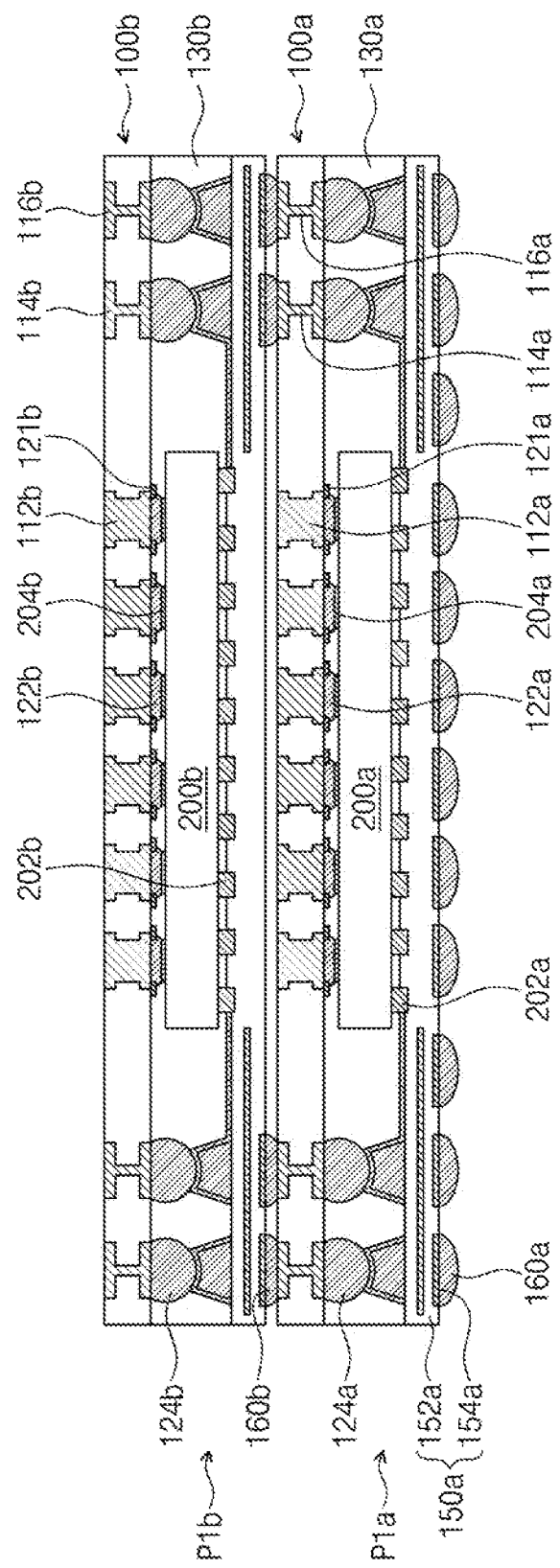
FIG. 13 is a diagram illustrating a semiconductor package structure according to a fourth modified example of the first exemplary embodiment.

FIG. 13 is a diagram illustrating a semiconductor package structure according to the fourth modified example of the first exemplary embodiment.

Referring to FIG. 13, a first semiconductor package structure P1a and a second semiconductor package structure P1b, according to the first exemplary embodiment described with reference to FIG. 8, may be provided. The second semiconductor package structure P1b may be provided on the first semiconductor package structure P1a.

The first semiconductor package structure P1a and the second semiconductor package structure P1b may be electrically connected to each other by a first connecting plug 114a of the first semiconductor package structure P1a, and thus, a die 200a in the first semiconductor package structure P1a and a die 200b in the second semiconductor package structure P1b may exchange signals with each other.

Also, the second semiconductor package structure P1b may be electrically connected to a second connecting plug 116a, and thus, may transmit and receive signals to and from an external device through the solder ball 160a of the first semiconductor package structure P1a.

According to an exemplary embodiment, the die 200a in the first semiconductor package structure P1a and the die 200b in the second semiconductor package structure P1b may have homogeneous or heterogeneous performance.

For example, in the case where the die 200a and the die 200b have the homogeneous performance, the die 200a and the die 200b may be processor chips. As another example, the die 200a and the die 200b may be memory chips.

By contrast, in the case where the die 200a and the die 200b have heterogeneous performance, the die 200a may be a processor chip and the die 200b may be a device that is interlocked with the processor chip. For example, the die 200b may be at least one of a sensor, a radio-frequency device, a modem, or an image processing device. It is obvious that an example of the device interlocked with the processor chip is not limited to this.

According to the afore-described fourth modified example, a semiconductor package structure including a stack of dies may be used to embody a package-on-package (POP) and system-in-package (SiP). This is because a semiconductor package structure according to an exemplary embodiment provides a peculiar structure which is easily extendable to a multi-layered structure.

Although, in FIG. 13, two semiconductor package structures are illustrated to be stacked, the number of the stacked semiconductor package structures may be three or more.

According to a fifth modified example of the first embodiment, a semiconductor package structure, in which dies have a side-by-side structure, may be provided, unlike the afore-described first exemplary embodiment and its modified examples. Hereinafter, a semiconductor package structure according to the fifth modified example of the first exemplary embodiment will be described with reference to FIG. 14.

Figure 14:
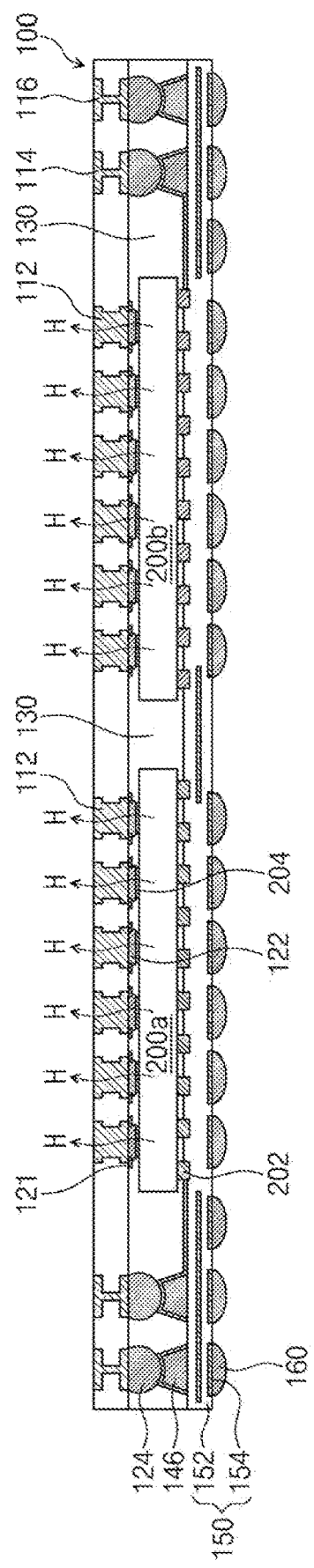
FIG. 14 is a diagram illustrating a semiconductor package structure according to a fifth modified example of the first exemplary embodiment.

FIG. 14 is a diagram illustrating a semiconductor package structure according to the fifth modified example of the first exemplary embodiment.

Referring to FIG. 14, the semiconductor package structure according to the first exemplary embodiment described with reference to FIG. 8 may be provided, but the die 200a and the die 200b are arranged adjacent to each other.

The die 200a and the die 200b may be electrically connected to each other by various methods. For example, the die 200a and the die 200b may be electrically connected to each other through the interconnection line 154 of the re-distribution layer 150. In other words, a contact pad of the die 200a and a contact pad of the die 200b may be connected to each other through the interconnection line 154. As another example, the die 200a and the die 200b may be connected to each other by an electroplating process described with reference to FIG. 6.

According to the fifth modified example of the first exemplary embodiment, the die 200a and the die 200b may be positioned at accurate positions through the afore-described self-alignment, and thus, even when the contact pad of the die has a fine pitch, it is possible to provide an effect of a precise process.

In the afore-described first exemplary embodiment, the base substrate has a plate shape, but according to a second exemplary embodiment, the die is formed that the base substrate has a shape having a cavity. Hereinafter, a semiconductor package structure and a fabrication method thereof, according to the second exemplary embodiment, will be described with reference to FIGS. 15 to 19.

FIGS. 15 to 18 are diagrams illustrating a semiconductor package structure and a fabrication method thereof, according to the second exemplary embodiment.

Figure 15:
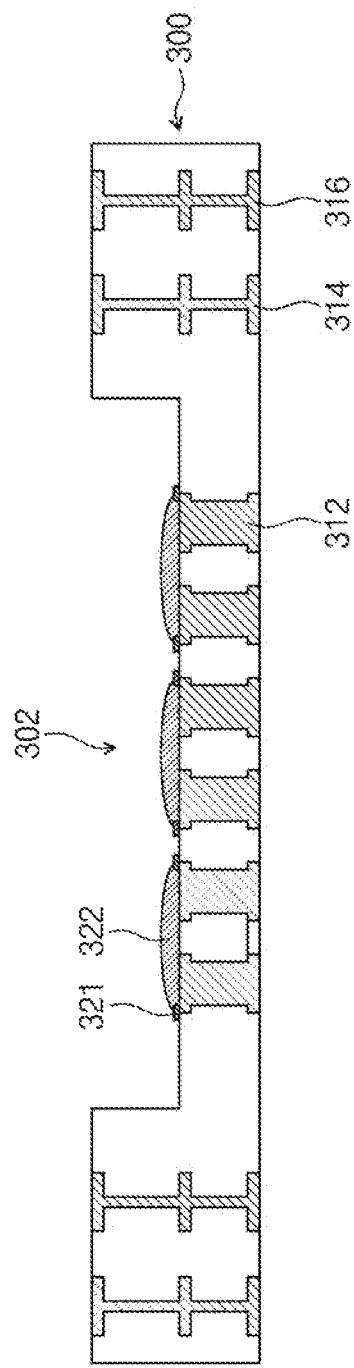

Referring to FIG. 15, a base substrate 300 may be prepared. The base substrate 300 may be a PCB substrate. The base substrate 300 may include a heat dissipation plug 312, a first connecting plug 314, and a second connecting plug 316.

The heat dissipation plug 312, the first connecting plug 314, and the second connecting plug 316 may penetrate the base substrate 300. Accordingly, opposite ends of the heat dissipation plug 312, opposite ends of the first connecting plug 314, and opposite ends of the second connecting plug 316 may be exposed.

The base substrate 300 may include a cavity 302. The heat dissipation plug 312 may be provided under a bottom surface of the cavity 302. An end of the heat dissipation plug 312 may constitute the bottom surface of the cavity 302. The base substrate 300 may include a convex portion enclosing the cavity 302. The first connecting plug 314 and the second connecting plug 316 may be provided in the convex portion.

A solder bump 322 may be provided on the heat dissipation plug 312. As shown in FIG. 15, one solder bump 322 may be provided on a plurality of the heat dissipation plugs 312. For a subsequent reflow process, the solder bump 322 may be formed of a metallic material having a relatively low melting point, as described with reference to FIG. 1.

According to an exemplary embodiment, a solder mask 321 may be formed between the heat dissipation plug 312 and the solder bump 322. The solder mask 321 may be formed of, for example, an epoxy-containing insulating ink. The solder mask 321 may define a solder mask define area, through which the heat dissipation plug 312 is in contact with the solder bump 322. The solder mask define area, which is opened by the solder mask 321, may have a shape and a size corresponding to, for example, the same shape and size as, a joining pattern 204 to be described below. For example, in the case where one joining pattern 204 corresponds to two heat dissipation plugs 312, the solder mask 321 may define an opening region having the same shape and size as the one joining pattern 204 on the two heat dissipation plugs 312. Accordingly, although the solder mask 321 defines an area, which is provided on the heat dissipation plug 312, and through which the solder bump 322 is provided to be in direct contact with the heat dissipation plug 312, the solder mask 321 may increase a self-alignment effect to be described below, because it provides the same shape and size as the joining pattern 204.

Although, in FIG. 15, one solder bump 322 is illustrated to be provided on a plurality of the heat dissipation plugs 312, it is obvious that the inventive concept is not limited thereto. For example, the solder bump 322 may be provided on each of the heat dissipation plugs 312 or one solder bump 322 may be provided on three or more heat dissipation plugs 312.

Figure 16:
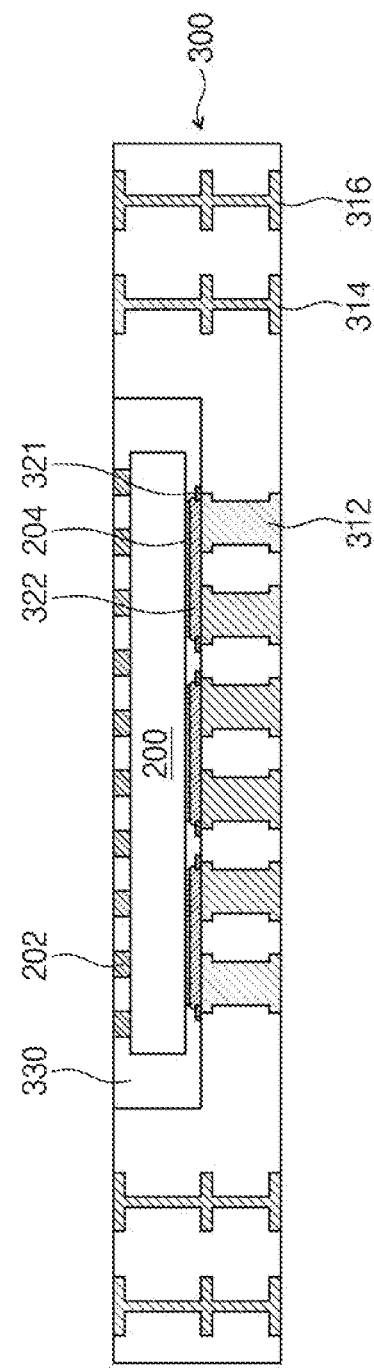

Referring to FIG. 16, a die 200 including a semiconductor device may be prepared, as described with reference to FIG. 2. The die 200 may include a contact pad 202 on one surface of the die 200 and a joining pattern 204 on another surface, opposite to the one surface, of the die 200, as described with reference to FIG. 2.

The die 200 may be disposed on the cavity 302 of the base substrate 300, in which the solder bump 322 is provided. In more detail, the die 200 may be provided on the base substrate 300, such that the joining patterns 204 of the die 200 are in contact with the solder bump 322. As described with reference to FIG. 2, the solder bump 322 may be reflowed, and thus, the die 200 may be easily bonded and self-aligned to the base substrate 300.

The solder bump 322 may include a first portion facing the die 200 and a second portion facing the heat dissipation plug 322. As shown in FIG. 16, the solder bump 322 may be provided on the heat dissipation plugs 322, and then, the die 200 may be provided on the heat dissipation plug 322, and in this case, the first portion may have a width that is smaller than that of the second portion.

In addition, the solder bump 322 may be provided on the die 200, that is, the bottom surface of the die 200, and then, the die 200 may be bonded to the base substrate 300, as described with reference to FIGS. 10 and 11.

The die 200 may be disposed in the cavity 302, and then, the cavity 302 may be filled with a polymer resin layer 330, as described with reference to FIG. 3.

Referring to FIG. 17, a re-distribution layer 350 may be formed on the die 200. The re-distribution layer 350 may include an interconnection line 354 and a passivation layer 352, which are electrically connected to the semiconductor device in the die 200. As shown in FIG. 17, some of the contact pads 202 may be electrically connected to the first connecting plug 314 by the interconnection line 354 in the re-distribution layer 350. It is obvious to those skilled in the art that the electric connection structure made by the interconnection line 354 in the re-distribution layer 350 is not limited to that shown in FIG. 17.

Referring to FIG. 18, a solder ball 360 electrically connected to the interconnection line 354 of the re-distribution layer 350 may be formed on the re-distribution layer 350. After the formation of the solder ball 360, the die 200 and the base substrate 300 including the re-distribution layer 350 may be upside down, and the solder ball 360 may be connected to an external device. Thus, signals produced in the semiconductor device in the die 200 may be transmitted to the external device.

According to the second exemplary embodiment, unlike the first exemplary embodiment, the first connecting plug 314 and the second connecting plug 316 may be electrically and directly connected to the interconnection line 354 in the re-distribution layer 350. Accordingly, even if a process of forming a solder bump and a contact plug on the first connecting plug 314 and the second connecting plug 316 is omitted, the first connecting plug 314 and the second connecting plug 316 may be electrically connected to the solder ball 360 with ease. Accordingly, it may be possible to provide a semiconductor package structure, of which a fabrication process is simplified, and which has a reduced fabrication cost, and a fabrication method thereof.

Furthermore, in the first exemplary embodiment, a reduction in distance between the second solder bumps 124 may cause a short circuit between the second solder bumps 124, but according to the second exemplary embodiment, an interconnection line corresponding to the second solder bump 124 is provided in the PCB, and thus, it may be possible to provide a semiconductor package structure having a fine pitch and a fabrication method thereof.

According to a modified example of the second embodiment, a semiconductor package structure may be provided to have a package-on-package (POP) structure, unlike the afore-described second exemplary embodiment. Hereinafter, a semiconductor package structure according to the modified example of the second exemplary embodiment will be described with reference to FIG. 19.

Figure 19:
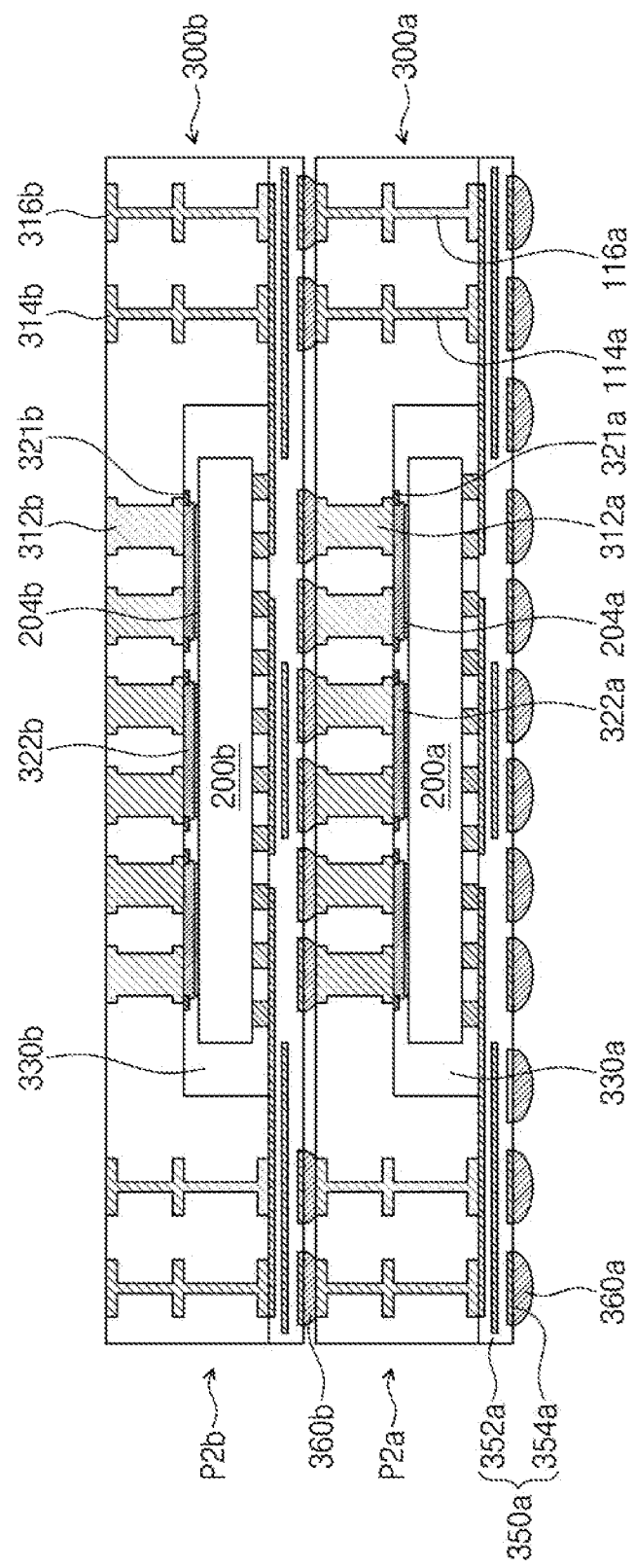
FIG. 19 is a diagram illustrating a semiconductor package structure according to a modified example of the second exemplary embodiment.

FIG. 19 is a diagram illustrating a semiconductor package structure according to the modified example of the second exemplary embodiment.

Referring to FIG. 19, a first semiconductor package structure P2a and a second semiconductor package structure P2b, according to the second exemplary embodiment described with reference to FIG. 18, may be provided. The second semiconductor package structure P2b may be disposed on the first semiconductor package structure P2a.

The first semiconductor package structure P2a and the second semiconductor package structure P2b may be electrically connected to each other by the first connecting plug 114a of the first semiconductor package structure P2a, and thus, the die 200a in the first semiconductor package structure P2a and the die 200b in the second semiconductor package structure P2b may exchange signals with each other. Here, the dies 200a and 200b in the first and second semiconductor package structures P2a and P2b may be composed of homogeneous or heterogeneous devices, as described with reference to FIG. 13.

Furthermore, the second semiconductor package structure P2b may be electrically connected to a second connecting plug 116a, and thus, may transmit and receive signals to and from an external device through the solder ball 160a of the first semiconductor package structure P2a.

Although, in FIG. 19, two semiconductor package structures are illustrated to be stacked, the number of the stacked semiconductor package structures may be three or more.

Furthermore, it is obvious that, in the semiconductor package structure according to the second exemplary embodiment, at least two dies can be arranged adjacent to each other, as described with reference to FIG. 14.

In the afore-described first and second exemplary embodiments, the base substrate may remain, whereas, according to a exemplary third embodiment, the base substrate may be removed. Hereinafter, a semiconductor package structure and a fabrication method thereof according to the third exemplary embodiment will be described with reference to FIGS. 20 to 23. For reference, the semiconductor package structure according to the third exemplary embodiment may be fabricated by removing the base substrate and the solder bump in the semiconductor package structures according to the afore-described first and/or second exemplary embodiments and their modified examples and moreover by removing a portion of the die.

Figure 20A:
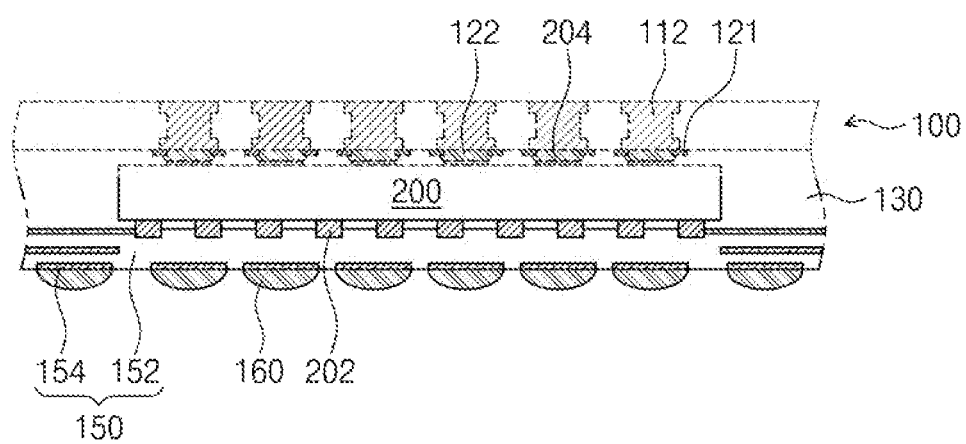
FIGS. 20A-20B, 21A-21B and 22-23 are diagrams illustrating semiconductor package structures and fabricating methods thereof, according to a third exemplary embodiment.
Figure 20B:
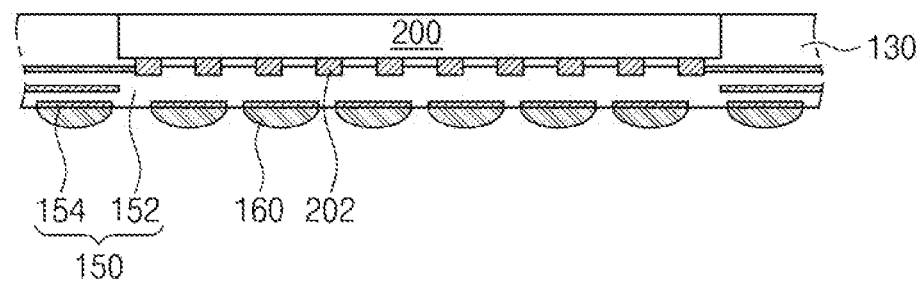

FIGS. 20A and 20B illustrate a semiconductor package structure and a fabrication method thereof, according to a third exemplary embodiment.

Referring to FIG. 20A, in order to form the semiconductor package structure according to the third exemplary embodiment, firstly, the semiconductor package structure according to the first exemplary embodiment previously described with reference to FIGS. 1 to 8 may be prepared.

A portion depicted by the dotted line of FIG. 20A may be removed from the semiconductor package structure fabricated according to the first exemplary embodiment. For example, a portion of the die 200, the solder bump, the solder mask, and the base substrate may be removed. In more detail, a portion of the die 200, the solder bump, the solder mask, and the base substrate may be removed by a chemical-mechanical polishing (CMP) process. Thus, a semiconductor package structure, from which a portion of the die 200 in direct contact with the solder bump is removed, may be provided, as shown in FIG. 20B.

The package structure according to the third exemplary embodiment may provide a slimmer semiconductor package structure, as shown in FIG. 20B. In other words, the package structure according to the third exemplary embodiment may provide a structure that is thin in a thickness direction.

In addition, the package structure according to the third exemplary embodiment may provide an easy alignment, because, as described above, the solder bump provides an interface, when the die is formed on the base substrate, in the package structure according to the first embodiment. In other words, even when the die is disposed on the base substrate with an error beyond an allowed error range, the die may be self-aligned at a proper position on the base substrate, due to the surface tension of the solder bump melted by the reflow.

In the description of the third exemplary embodiment described with reference to FIGS. 20A and 20B, an example, in which all of a portion of the die, the solder bump, and the base substrate are removed, is described, but it is obvious that only a portion of them is removed.

It is obvious that the method of fabricating a semiconductor package, according to the third exemplary embodiment may be performed as a subsequent process on the semiconductor package structure according to the first modified example of the first exemplary embodiment described with reference to FIG. 10 and on the semiconductor package structure according to the second modified example of the first exemplary embodiment described with reference to FIG. 11.

Figure 21A:
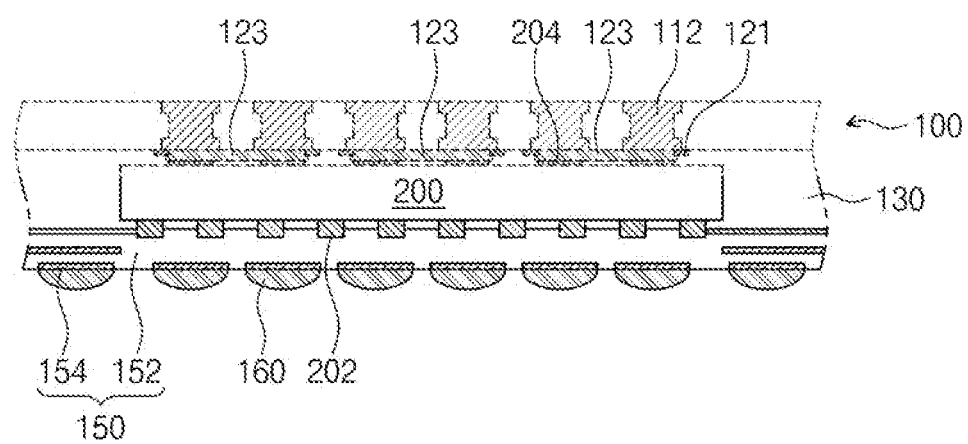
Figure 21B:
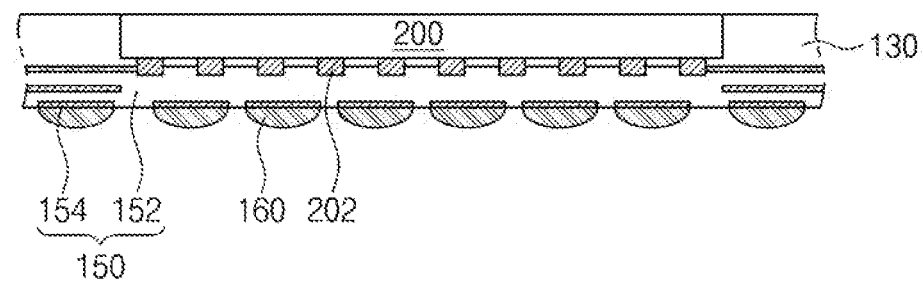

FIGS. 21A and 21B illustrate a semiconductor package structure and a fabrication method thereof, according to the third exemplary embodiment.

Referring to FIGS. 21A and 21B, a semiconductor package structure and a fabrication method thereof, according to the third exemplary embodiment, may be applied to the semiconductor package structure and the fabrication method thereof, according to the third modified example of the first exemplary embodiment described with reference to FIG. 12.

Referring to FIG. 21A, in order to form the semiconductor package structure according to the third exemplary embodiment, firstly, the semiconductor package structure according to the third modified example of the first exemplary embodiment previously described with reference to FIG. 12 may be prepared.

A portion depicted by the dotted line of FIG. 21A may be removed from the semiconductor package structure fabricated according to the first exemplary embodiment. For example, a portion of the die 200, the solder bump, and the base substrate may be removed. In more detail, a portion of the die 200, the solder bump, and the base substrate may be removed by a chemical-mechanical polishing (CMP) process. Accordingly, a semiconductor package structure, from which a portion of the die 200 in direct contact with the solder bump is removed, may be provided, as shown in FIG. 21B.

The package structure according to the third exemplary embodiment may provide a slimmer semiconductor package structure, as shown in FIG. 21B. In other words, the package structure according to the third exemplary embodiment may provide a structure that is thin in a thickness direction.

Furthermore, the package structure according to the third exemplary embodiment may provide an easy alignment, because the solder bump provides an interface when the die is formed on the base substrate. In other words, even when the die is disposed on the base substrate with an error beyond an allowed error range, the die may be self-aligned at a proper position on the base substrate, owing to the surface tension of the solder bump melted by the reflow.

In the description of the third exemplary embodiment described with reference to FIGS. 21A and 21B, an example, in which all of a portion of the die, the solder bump, and the base substrate are removed, is described, but it is obvious that only a portion of them is removed.

Furthermore, referring to FIG. 22, it is obvious that the method of fabricating a semiconductor package according to the third exemplary embodiment may be performed as a subsequent process on the semiconductor package structure and for the fabrication method thereof, according to the fourth modified example of the first exemplary embodiment described with reference to FIG. 13.

Figure 22:
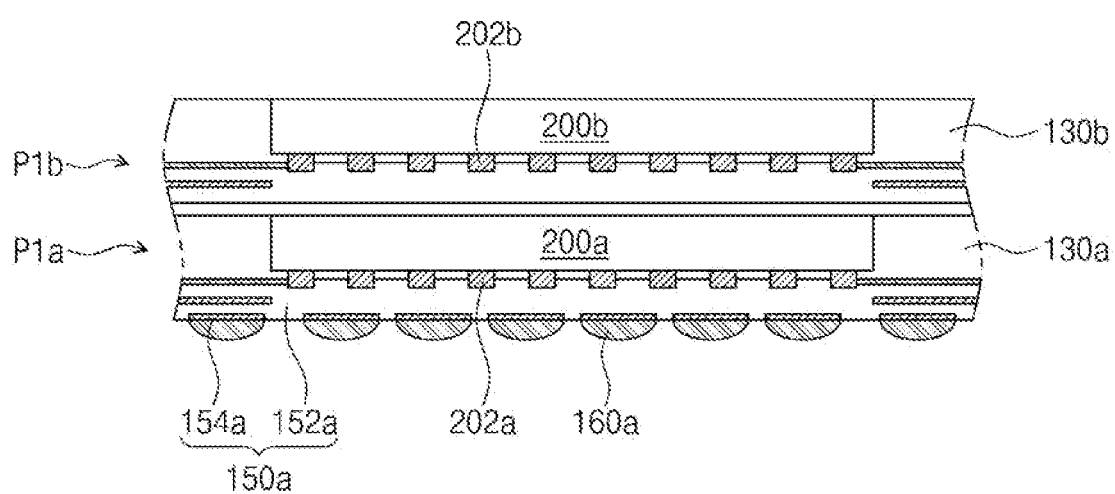

As shown in FIG. 22, in the case where the method of fabricating a semiconductor package structure according to the third exemplary embodiment is applied to a semiconductor package structure stacked in a thickness direction, it may be possible to reduce a thickness and thereby to provide a compact design.

Figure 23:
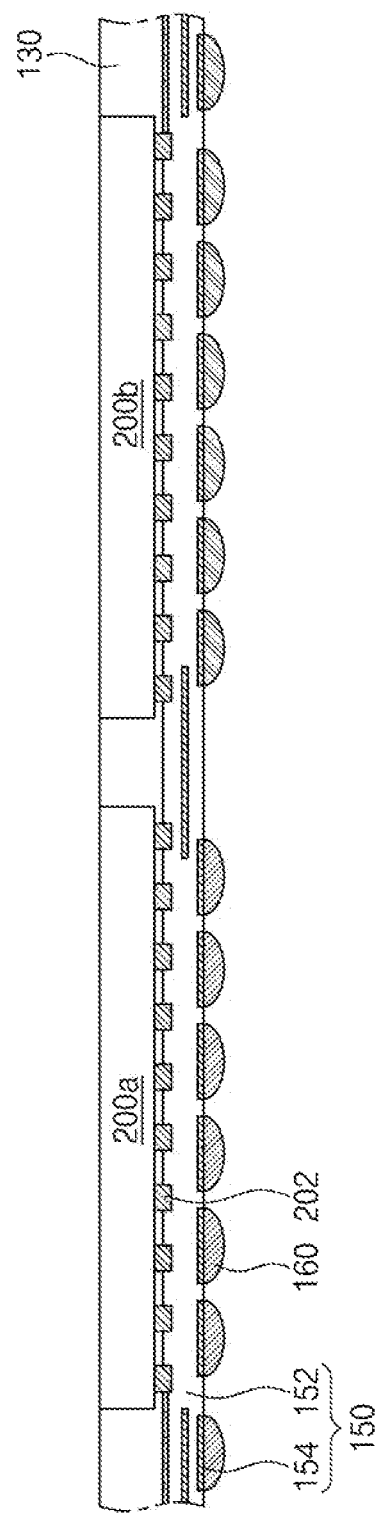

Furthermore, referring to FIG. 23, it is obvious that the method of fabricating a semiconductor package according to the third exemplary embodiment may be performed as a subsequent process on the semiconductor package structure and for the fabrication method thereof, according to the fifth modified example of the first exemplary embodiment described with reference to FIG. 14.

In addition, although not shown, it is obvious that the method of fabricating a semiconductor package, according to the third exemplary embodiment, may also be used as a subsequent process on the semiconductor package structure and the fabrication method thereof, according to the second exemplary embodiment described with reference to FIGS. 15 to 18 and on the semiconductor package structure and the fabrication method thereof, according to the modified example of the second exemplary embodiment described with reference to FIG. 19.

An example, in which the semiconductor package structures according to the afore-described embodiments and modified examples thereof can be used, will be described.

Figure 24:
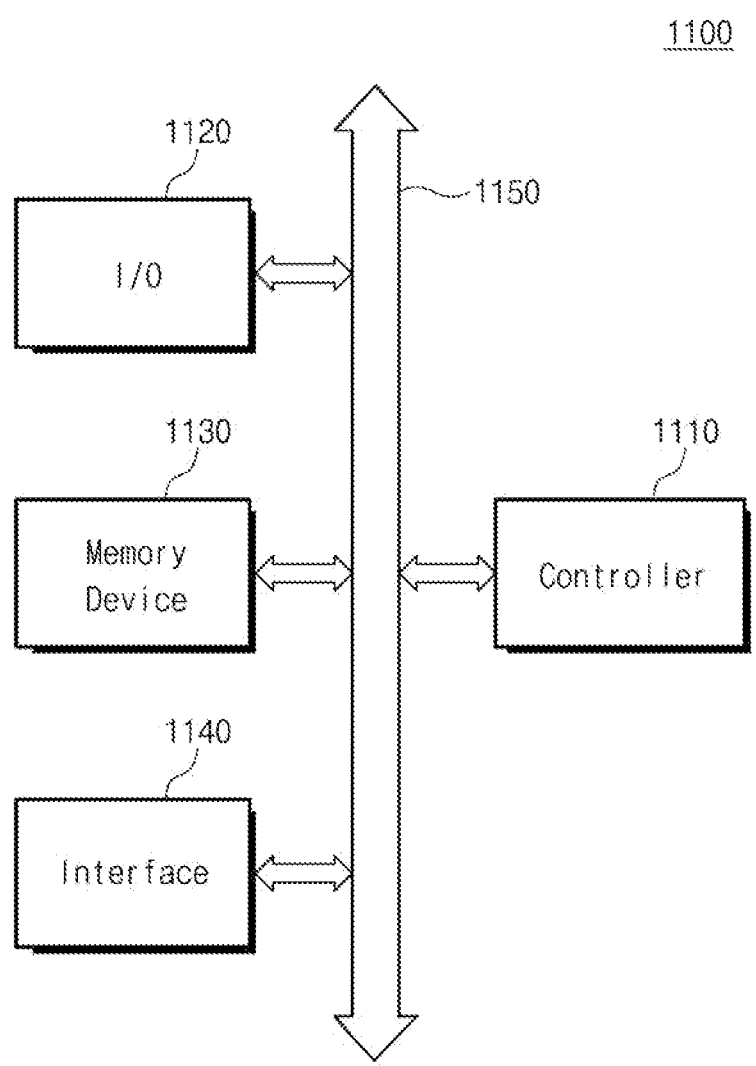
FIG. 24 is a block diagram schematically illustrating an example of an electronic system including a semiconductor package structure according to an exemplary embodiment.

FIG. 24 is a block diagram schematically illustrating an example of an electronic system including a semiconductor package structure according to an exemplary embodiment.

Referring to FIG. 24, an electronic system 1100 according to an exemplary embodiment may include a controller 1110, an input-output (I/O) unit 1120, a memory device 1130, an interface 1140, and a bus 1150. The controller 1110, the input-output unit 1120, the memory device 1130, and/or the interface 1140 may be connected with each other through the bus 1150. The bus 1150 may correspond to a path through which data are transmitted.

The controller 1110 may include at least one of a microprocessor, a digital signal processor, a microcontroller, or another logic device, which is configured to have a similar function to any one of them. According to an exemplary embodiment, the controller 1110 may include at least one of the semiconductor package structures according to the afore-described embodiments. The input-output unit 1120 may include a keypad, a keyboard, a display device, and so forth. The memory device 1130 may store data and/or commands. According to an exemplary embodiment, the memory device 1130 may include at least one of the semiconductor package structures disclosed through the afore-described embodiments.

The interface unit 1140 may execute a function of transmitting electrical data to a communication network or receiving electrical data from a communication network. The interface unit 1140 may operate in a wired or wireless manner. For example, the interface 1140 may include an antenna, a wired/wireless transceiver, or the like. Although not shown, the electronic system 1100 further includes a fast DRAM and/or static random access memory (SRAM) device, which is used as an operation memory for improving an operation of the controller 1110.

The electronic system 1100 may be applied to a personal digital assistant (PDA), a portable computer, a web tablet, a wireless phone, a mobile phone, a digital music player, a memory card, or any electronic product, which is configured to receive and/or transmit information in a wireless environment.

While the inventive concept has been shown and described with reference to some exemplary embodiments thereof, the scope of the inventive concept is by no means limited to the specific exemplary embodiments. Rather, the scope of the invention shall be defined by the accompanying claims. It will be understood by those skilled in the art that various changes in forms and details may be made therein without departing from the spirit and scope of the inventive concept.

INDUSTRIAL APPLICABILITY

Semiconductor package structures and fabricating methods thereof according to the above exemplary embodiments and modifications can be applied to various package structures. For example, semiconductor package structures and fabricating methods thereof according to the above exemplary embodiments and modifications can be applied to a wafer- and/or panel-level fan-out package field.

The invention claimed is:
1. A semiconductor package structure, comprising:
a first package structure comprising:
a first redistribution structure comprising metallization patterns and dielectric layers;

a first die over and electrically connected to the first redistribution structure, an active side of the first die comprising contact pads facing the first redistribution structure, and an inactive side of the first die comprising a joining pattern and a solder bump joined to the joining pattern on the first die;

a second die over the first die;

a first connecting plug adjacent the first die and the second die, the first connecting plug electrically connected to the first redistribution structure;

an encapsulant laterally encapsulating the first die, the second die, and the first connecting plug; and thermal elements on a back-side of the second die;

a second redistribution structure over the back side of the second die and the first connecting plug, the second redistribution structure comprising metallization patterns and a dielectric layer, the second redistribution structure being electrically connected to the first connecting plug; and a second package structure bonded to the metallization patterns of the second redistribution structure with a first set of conductive connectors.

2. The semiconductor package structure of claim 1, further comprising:

a base substrate interposed between the first die and the first connecting plug, collectively, and the second die, the base substrate including heat dissipation plugs penetrating the base substrate; and a solder mask disposed on the base substrate, the solder mask defining an opening area that corresponds to at least two of the heat dissipation plugs.

3. The semiconductor package structure of claim 2, wherein the solder bump connects the heat dissipation plugs and the joining pattern to each other.

4. The semiconductor package structure of claim 3, wherein the solder bump is disposed in the opening area between the heat dissipation plugs and the first die, and is configured to discharge heat generated in the first die to an outside.

5. The semiconductor package structure of claim 3, wherein the joining pattern is electrically disconnected from the first die.

6. The semiconductor package structure of claim 3, wherein the solder bump comprises a first portion facing the first die and a second portion facing the heat dissipation plugs, and wherein a width of the first portion is different than a width of the second portion.

7. The semiconductor package structure of claim 3, wherein a direction of heat, which is generated in the first die and is discharged to the outside through the solder bump, and a direction of a signal, which is produced by a semiconductor device in the first die and is transmitted to an external device through the solder bump, are anti-parallel to each other.

8. The semiconductor package structure of claim 3, wherein the solder bump is connected to two of the heat dissipation plugs.

9. The semiconductor package structure of claim 3, wherein the joining pattern provides an interface between the first die and the solder bump, and wherein the joining pattern is electrically disconnected from the first die.

* * * * *